(12) United States Patent
Rietzler

(10) Patent No.: US 8,188,867 B2
(45) Date of Patent: May 29, 2012

(54) TRANSPONDER INLAY FOR A PERSONAL DOCUMENT AND METHOD FOR THE PRODUCTION THEREOF

(75) Inventor: Manfred Rietzler, Marktoberdorf (DE)

(73) Assignee: Smartrac IP B.V., Amsterdam (NL)

( * ) Notice: Subject to any disclaimer, the term of this patent is extended or adjusted under 35 U.S.C. 154(b) by 0 days.

(21) Appl. No.: 13/043,718

(22) Filed: Mar. 9, 2011

(65) Prior Publication Data

US 2011/0155811 A1 Jun. 30, 2011

Related U.S. Application Data

(63) Continuation of application No. 11/867,804, filed on Oct. 5, 2007, now abandoned.

(51) Int. Cl.
*G08B 13/14* (2006.01)
*H01L 21/00* (2006.01)
(52) U.S. Cl. .................. 340/572.8; 340/572.1; 438/106; 438/110
(58) Field of Classification Search ............... 340/572.1, 340/572.8; 438/106, 110
See application file for complete search history.

(56) References Cited

U.S. PATENT DOCUMENTS

| 4,483,067 | A | * | 11/1984 | Parmentier | ...................... 29/840 |
| 4,737,620 | A | * | 4/1988 | Mollet et al. | .................. 235/492 |
| 6,709,889 | B2 | * | 3/2004 | Gore et al. | ..................... 438/106 |

FOREIGN PATENT DOCUMENTS

| DE | 4241482 | 6/1994 |
| WO | WO 88/08171 | 10/1988 |

* cited by examiner

*Primary Examiner* — Brent Swarthout
*Assistant Examiner* — Andrew Bee
(74) *Attorney, Agent, or Firm* — McGlew and Tuttle, P.C.

(57) ABSTRACT

The invention relates to a transponder inlay (11) for manufacturing a layered structure (40) for a personal document with a substrate layer (12) for arranging a transponder unit (15) that includes an antenna coil (13) and a chip module (14) and which is situated on a contact surface (17) of the substrate layer, wherein the chip module (14) is accommodated in a window opening (30) formed in the substrate layer (12) in such a way that a chip carrier (23) of the chip module rests with its circumferential edge on a compressed peripheral shoulder (24) of the window opening (30); the invention also relates to a method for manufacturing the transponder inlay. In addition, the present invention relates to a layered structure for a personal document, which is provided with such a transponder inlay, and an identification document having such a layered structure.

9 Claims, 1 Drawing Sheet

TRANSPONDER INLAY FOR A PERSONAL DOCUMENT AND METHOD FOR THE PRODUCTION THEREOF

CROSS REFERENCE TO RELATED APPLICATIONS

This application is a continuation of, and claims the benefit of priority under 35 U.S.C. §120 of, U.S. patent application Ser. No. 11/867,804 filed Oct. 5, 2007, now abandoned the entire contents of which are incorporated herein by reference.

FIELD OF THE INVENTION

The present invention relates to a transponder inlay for manufacturing a layered structure for a personal document with a substrate layer for arranging a transponder unit comprising an antenna coil and a chip module, said transponder unit being situated on a contact surface of the substrate layer, and a method for manufacturing the transponder inlay. In addition, the present invention relates to a layered structure for a personal document provided with such a transponder inlay as well as an identification document having such a layered structure.

BACKGROUND OF THE INVENTION

Current trends in the field of personal documents are in the direction of supplementing the documents that are conventionally used for personal identification with transponders which permit automated contactless reading of the data stored on a chip in the transponder. Such transponders include, in addition to the chip, an antenna coil that allows contactless data access.

Integration or implementation of such transponders in conventional personal documents that contain a plurality of pages of paper accommodated in a document volume makes special demands of the design of the transponder units and/or the so-called transponder inlays, which have the transponder unit on a substrate layer. It is obvious that it is regarded as desirable to interfere with the known format of the identification documents as little as possible through implementation of such a transponder inlay in an identification document. Furthermore, handling of the identification documents, e.g., the pages in such a document, should be influenced as little as possible. On the other hand, the transponder inlays and/or the transponder units arranged on the substrate layers of the transponder inlays are of course subject to special mechanical stresses which naturally derive from the handling of these identification documents.

For the reasons given above, it is therefore assumed that it is especially important to design the transponder inlays intended for implementation in identification documents to be as thin as possible. A reduction in the thickness of the substrate layers used for the transponder inlays is limited already by the thickness of the chip modules if it is assumed that the chip modules are to be accommodated so they are essentially flush with the surface in the transponder inlays.

Designing suitable recesses or window openings in the substrate layers is therefore associated with a significant expense and complexity.

SUMMARY OF THE INVENTION

The object of the present invention is therefore to propose a transponder inlay and a method of manufacturing same so that the manufacturing allows transponder inlays to be designed to be as thin as possible at a comparatively low cost.

This object is achieved by a transponder inlay having a layered structure for a personal document. The transponder inlay has a substrate layer for arranging a transponder unit. The transponder unit comprises an antenna coil and a chip module and is situated on a contact surface of the substrate layer. The chip module is accommodated in a window opening formed in the substrate layer, such that a chip carrier of the chip module rests with its peripheral edge on a compressed peripheral shoulder of the window opening.

The peripheral shoulder of the window opening, which allows the chip carrier to be accommodated in such a way that it is flush with the surface, is implemented by compressing the material of the substrate layer in the area of the window opening, in contrast with the design known from the state of the art, in which, depending on the choice of material for the substrate layer, either only one chip housing of the chip module arranged on the chip carrier is accommodated in the window opening, and the chip carrier protruding laterally beyond the chip housing rests on the surface of the substrate layer, or the chip carrier rests on a peripheral shoulder of a window formed by a milling operation in the substrate layer to accommodate the entire chip module including the chip carrier.

An optimum arrangement with regard to completely accommodating the chip module in the substrate layer in such a way as to protect the chip module from mechanical stresses and with regard to the thinnest possible design of the substrate layer is possible if the chip module is accommodated in the window opening in such a way that the chip carrier is arranged to be essentially flush with the contact surface of the substrate layer, and a chip housing of a chip unit arranged on the chip carrier is situated to be essentially flush with the underside of the substrate layer opposite the contact surface.

An arrangement of the antenna coil on the contact surface of the substrate layer so that it is also flush with the surface is made possible if the antenna coil is formed from a wire conductor which is provided in a coil on the contact surface and arranged to be essentially flush with the contact surface by embedding it in the contact surface.

It has proven especially advantageous if the substrate layer of the transponder inlay is made of a thermoelastic material, so that, on the one hand, a protective elastic sheathing is provided for the chip module, keeping mechanical stresses away from the chip because of its elasticity, and, on the other hand, a permanent compression is possible in the circumferential area of the window opening to form the peripheral shoulder through a temperature-supported pressure acting on the substrate material with a minimal expenditure of energy.

The inventive layered structure for a personal document has, in addition to the transponder inlay, a cover layer of a book binding material for personal documents arranged as an additional layer on the contact surface of the transponder inlay.

The inventive layered structure may thus consist of just two layers bonded together, supplemented by conventional intermediate pages in a simple manner to yield a personal document which is provided with a transponder unit despite giving the appearance of being a conventional personal document. The inventive layered structure thus allows the production of an identification document that essentially shows no difference from a conventional personal document from a purely external standpoint.

Depending on the choice of material and/or the composition of the material for the cover layer, the bond between the substrate layer and the cover layer may be created by arranging an adhesive intermediate layer or by direct lamination of the cover layer onto the substrate layer to produce the layered structure. The latter is the case, for example, when the cover layer is a textile fabric coated with thermally activatable adhesive or some other laminatable material.

It is especially advantageous if the layered structure is designed to be double-sided, with a substrate layer designed to be discontinuous, having the transponder unit on the transponder page and having a blank page that is divided from the transponder page by a fold recess and with a cover layer designed to be continuous, extending over the substrate layer. Such an embodiment of the layered structure in combination with the intermediate pages of a personal document makes it possible to produce a personal document that gives the user the impression of being a conventional personal document despite the implementation of the transponder unit in the front page or the back page of the binding.

The inventive method for producing a transponder inlay forms a window opening that holds the chip module. A through-opening is created in the substrate layer, and the peripheral edge of the through-opening is exposed to pressure and temperature to achieve a compressed peripheral shoulder with a reduced thickness.

It is especially advantageous if the treatment with pressure and temperature is accomplished by means of an ultrasonically energized stamping tool. The temperature treatment may be accomplished by external heating of the stamping tool or by a heating of the stamping tool and/or substrate layer induced by mechanical friction as a result of the ultrasonic oscillations of the stamping tool, i.e., without external overheating.

In addition, it has also proven to be especially advantageous if the stamping tool is used at the same time to form the through-opening because this allows the creation of the window opening as well as the creation of the peripheral shoulder in one machining operation using one and the same tool.

A variant of the method that is optimized with regard to universal tool use is made possible if the stamping tool serves at the same time to embed a wire conductor, which is used to produce the antenna coil, in the contact surface of the substrate layer.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
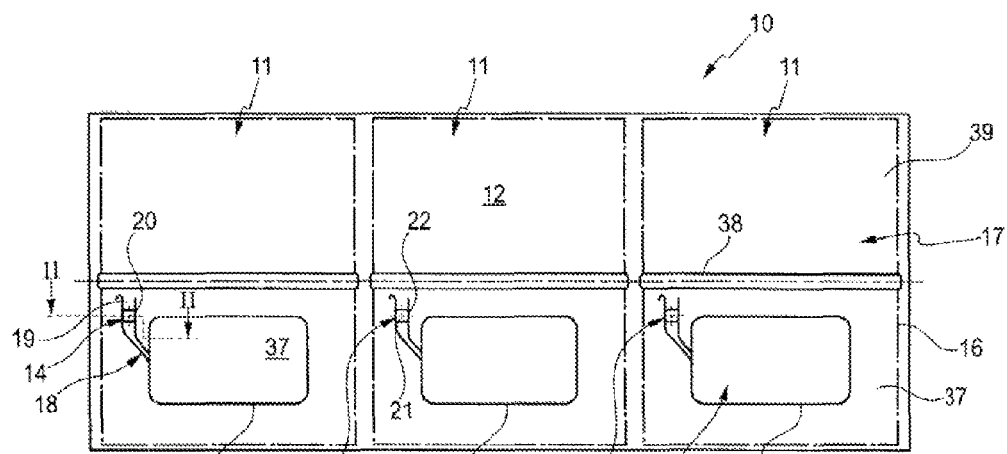
FIG. 1 shows a panel sheet arrangement with three transponder inlays designed contiguously.

Referring to the drawings in particular, FIG. 1 shows three transponder inlays 11 that are designed to be joined together in a panel sheet arrangement 10, each transponder inlay having a substrate layer 12 with a transponder unit 15 arranged thereon, comprising an antenna coil 13 and a chip module 14. FIG. 1 also shows dividing lines 16 along which the transponder inlays 11 can be separated from the panel sheet arrangement.

Figure 2:
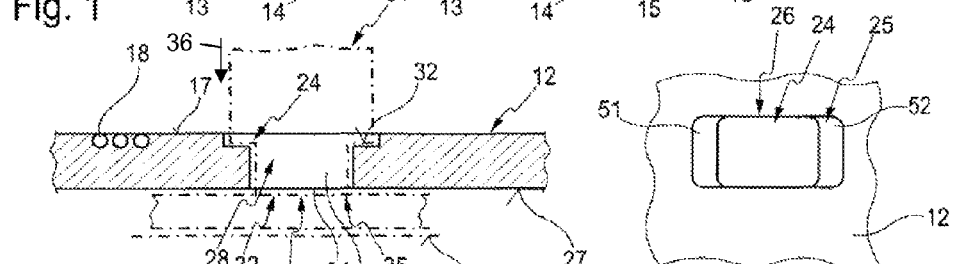
FIG. 2 shows a window opening of a substrate layer in an enlarged diagram according to sectional line II-II in FIG. 1.
Figure 5:
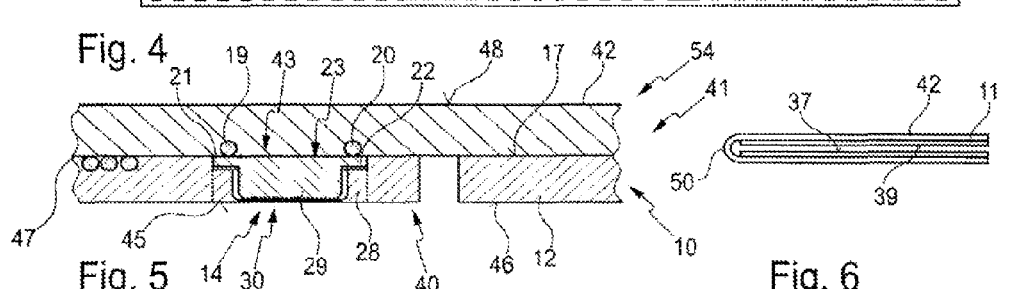
FIG. 5 shows a partial sectional diagram of the layered structure shown in FIG. 4 according to sectional line V-V in FIG. 4.

The diagram in FIG. 1 shows the transponder inlays 11 in a view from above with a contact surface 17 that faces upward and has a wire conductor 18 arranged thereon in the form of a coil embedded in the contact surface 17, as also illustrated in FIG. 2. As shown in FIG. 5 in particular, free ends 19, 20 of the wire conductor are in contact with contact surfaces 21, 22 of a chip carrier 23 of the chip module 14 arranged in the contact surface 17 of the substrate layer 12.

Figure 3:
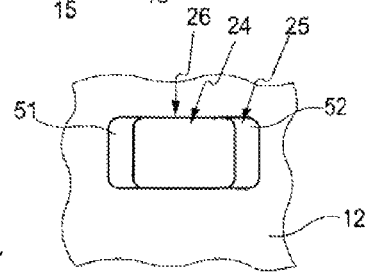
FIG. 3 shows the window opening from FIG. 2 in a view from above.

The chip module 14 sits in a window opening 30, as illustrated in FIGS. 2 and 3. For reasons of a simple diagram of the window opening 30, FIGS. 2 and 3, in deviation from the diagram in FIG. 1, omit the chip module 14, which is inserted into the window opening 30. The window opening 30 is designed with a step gradation and has a peripheral shoulder 24 facing the contact surface 17 to accommodate the chip carrier 23 (FIG. 5) and, as shown in FIG. 3, having a accommodating cross section 25, which is designed to be larger than the accommodating cross section 26 of a through-opening 28 that extends to an underside 27 of the substrate layer 12 and serves to accommodate a chip housing 29 of the chip module 14 (FIG. 5).

The through-opening 28 as well as the peripheral shoulder 24 are adapted to the particular chip module to be accommodated. The chip module 14, which is used in the present exemplary embodiment, is a chip module 14 having a chip carrier 23 that is designed to be larger than the chip housing 29 in only one dimension. Therefore, in the exemplary embodiment shown here, the peripheral shoulder 24 is designed so that the peripheral shoulder 24 forms supporting surfaces 51, 52 for the chip carrier 23 on only two opposing edge sections (FIG. 3).

To produce the window opening 30 shown in FIGS. 2 and 3, a stamping tool 31, for example, having a stamp tip 33 bordered by a stamp collar 32 may be used. The stamp tip 33 has a cross section corresponding to the through-opening 28, and the stamp collar 32 has a cross section corresponding to the peripheral shoulder 24. In addition, the stamp tip 33 is provided with a cutting edge 35 formed peripherally on the border of its end face 34.

To produce the window opening 30 illustrated in FIGS. 2 and 3, the stamping tool 31 may be advanced toward a contact surface 53 with an intermediate arrangement of the substrate layer 12, so that the through-opening 28 is produced by the action of the cutting edge 35 on the substrate layer 12, based essentially on a punching operation. Simultaneously with a forward movement 36 of the stamping tool 31, this forward movement 36 may be exposed to ultrasonic vibrations in the direction of the forward movement or across that direction, so there is a relative heating of the substrate layer 12 due to the relative movement between the stamp collar 32 and the contact surface 17 of the substrate layer 12. As a result of this heating, the compression of the substrate layer 12 which occurs due to the forward movement 36 is irreversible, i.e., it is a more or less frozen-in compression. If the material chosen for the substrate layer 12 is a thermoelastic material, then a certain elasticity is retained in the compressed area of the peripheral shoulder 24 despite the thermal stress on the material. Essentially, however, it is also possible to produce a window opening in a thermoplastic material in the manner depicted in FIGS. 2 and 3.

In deviation from the embodiments described above, it is also possible to produce the peripheral shoulder 24 not in direct correlation with the design of the through-opening 28 but instead first producing the through-opening 28 in any desired manner in a first process step and then designing the peripheral shoulder 24 by means of an ultrasonically energized stamping tool.

The transponder inlays 11 of the panel sheet arrangement 10 shown in FIG. 1 are designed to be double-sided with a transponder page 37, on which there is a transponder unit 15, and with a blank page 39, which is separated from the transponder page 37 by a fold recess and has the same area as the transponder page 37 of the substrate layer 12.

Figure 4:
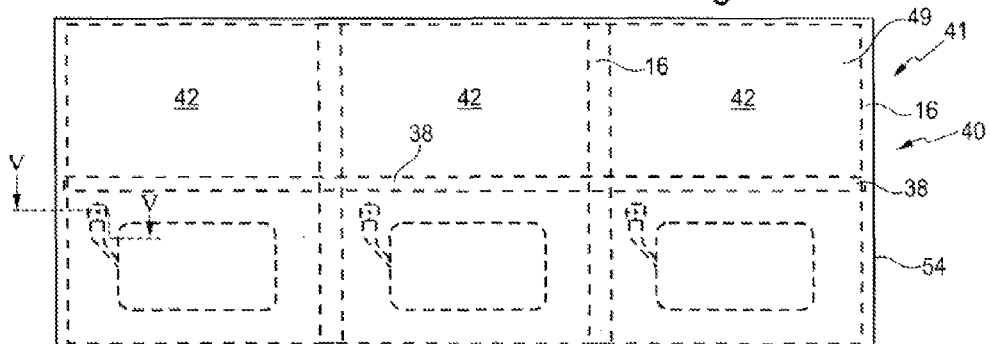
FIG. 4 shows a panel sheet arrangement with three bound pages designed contiguously for production of a layered structure for an identification document.

FIGS. 4 and 5 show a layered structure 40 with bound pages 49 designed to be cohesive with one another in a panel sheet arrangement 41. The panel sheet arrangement 41 consists of the panel sheet arrangement shown in FIG. 1 with the transponder inlays 11 and a panel sheet arrangement 54 arranged on the contact surface 17 and having cover layers 42 arranged in the laminate. In a partial sectional diagram, FIG. 5 shows the layered structure 40 of the panel sheet arrangement 41 and/or a bound page 49 provided therein on an enlarged scale. It can be seen in particular that the chip module 14 is arranged in the window opening 30 of the substrate layer 12 in such a way that a contact side 43 of the chip carrier 23 is essentially flush with the contact surface 17 of the substrate layer 12. The chip housing 29 which encloses a chip unit (not shown here) and extends downward from the chip carrier 23 is accommodated completely in the through-opening 28 of the window opening 30. A housing top side 45 is situated so that it is slightly offset toward the interior into the window opening 30 or is arranged essentially flush with the bottom side 46 of the substrate layer 12. In the exemplary embodiment depicted in FIG. 5, the chip carrier 23 is adhesively bonded to the supporting surfaces 51, 52 of the peripheral shoulder 24.

FIG. 5 also shows that an adhesive intermediate layer 47 that bonds the cover layer 42 and the transponder inlay 11 to form a fixed layered structure 40 is arranged between the cover layer 42 and the contact surface 17 of the substrate layer 12 and/or the transponder inlay 11. The wire conductor ends 19, 20 of the antenna coil 13 that are in contact with the contact surfaces 21, 22 of the chip carrier 23 are accommodated essentially in the intermediate layer 47, so that with an inelastic design of the cover layer 42, no representation of the wire conductor ends 19, 20 in an outside or a visible side 48 of the cover layer 42 need be feared.

Figure 6:
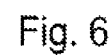
FIG. 6 shows a bound page folded over to form a bound back cover.

The bound pages 49 arranged in a cohesive laminate in the panel sheet arrangement 54 according to FIG. 4 are formed by the layered structure 40 depicted in FIG. 5 and can be separated by a punching operation along the dividing lines 16. Since the cover layers 42 extend continuously over the fold recess 38 in the substrate layer 12 and/or the transponder inlay 11, the bound pages 49 have a corresponding reduction in cross section in the area of the fold recesses 38, allowing the bound pages 49 to be turned or folded about the bound back 50 defined by the fold recess 38, as illustrated in FIG. 6. Then any intermediate pages containing personal information in a conventional manner can be inserted into an insertion space bordered by the blank page 39 and the transponder page 37 of the transponder inlay 11.

While specific embodiments of the invention have been shown and described in detail to illustrate the application of the principles of the invention, it will be understood that the invention may be embodied otherwise without departing from such principles.

What is claimed is:

1. A method for manufacturing a transponder inlay for a personal document, the method comprising the steps of:

providing a chip module as part of the transponder, the chip module including a chip housing and a chip carrier, the chip carrier having a length larger than a length of the chip housing, the chip module having a thickness;

providing a substrate as part of the personal document, the substrate being formed of a material that is permanently conformable by one of heat and compression, the substrate having a contact surface, the substrate having a thickness substantially equal to the thickness of the chip module;

providing a stamping tool with a stamp tip at one end of the stamping tool, the stamp tip including a cutting edge, the cutting edge having a shape to cut a through-opening in the substrate, where the through-opening has a size corresponding to a size of the chip housing, the stamping tool also including a stamp collar spaced from the stamped tip, the stamp collar having a size corresponding to a size of the chip carrier;

pressing the stamping tool against the contact surface of the substrate to cause the cutting edge to cut the through-opening in the substrate, said pressing also causing the stamp collar to create a permanent shoulder around the through-opening, said pressing being performed to space the shoulder from the contact surface by a thickness substantially equal to a thickness of the chip carrier;

placing the chip module in the through-opening with the chip housing completely in the through-opening and with the chip carrier being adjacent the shoulder;

providing a cover layer;

arranging the cover layer on the contact surface of the substrate with the cover layer covering the chip module.

2. A method in accordance with claim 1, further comprising:

embedding a wire conductor in the substrate as an antenna;

connecting free ends of the wire conductor to contact surfaces of the chip carrier;

providing an adhesive intermediate layer between the cover layer and the contact surface of the substrate, the adhesive intermediate layer bonding the cover layer to the substrate, the free ends of the wire conductor being accommodated in the adhesive intermediate layer.

3. A method in accordance with claim 2, wherein:

said embedding arranges the wire conductor in a coil pattern on the contact surface, the wire conductor being arranged essentially flush with the contact surface.

4. A method in accordance with claim 1, further comprising:

heating the substrate during said pressing of the stamping tool, said heating and said pressing cooperating to form the permanent shoulder;

the substrate being made of a thermoelastic material.

5. A method in accordance with claim 4, wherein:
said heating of the substrate is performed by the stamping tool.

6. A method in accordance with claim 5, further comprising:
ultrasonically vibrating the stamping tool during said pressing to perform said heating of the substrate by the stamping tool.

7. A method in accordance with claim 2, wherein:
said pressing of the stamping tool also performs the step of embedding the wire conductor in the substrate.

8. A method in accordance with claim 1, further comprising:
arranging the substrate and the cover layer as a first page and a last page of the personal document, said substrate having an interruption in an area of a fold between the first page and the last page;
arranging intermediate pages between the first and last pages.

9. A method in accordance with claim 7, further comprising:
heating the substrate during said pressing of the stamping tool, said heating and said pressing cooperating to form the permanent shoulder;
said heating of the substrate is performed by the stamping tool;
ultrasonically vibrating the stamping tool during said pressing to perform said heating of the substrate by the stamping tool;
the substrate being made of a thermoelastic material;
said embedding arranges the wire conductor in a coil pattern on the contact surface, the wire conductor being arranged essentially flush with the contact surface;
arranging the substrate and the cover layer as a first page and a last page of the personal document, said substrate having an interruption in an area of a fold between the first page and the last page;
arranging intermediate pages between the first and last pages.

* * * * *